US 6,904,406 B2

(12) United States Patent
Yamaji (10) Patent No.: US 6,904,406 B2
(45) Date of Patent: Jun. 7, 2005

(54) AUDIO PLAYBACK/RECORDING APPARATUS HAVING MULTIPLE DECODERS IN ROM

(75) Inventor: Hirotaka Yamaji, Tokyo (JP)

(73) Assignee: NEC Corporation, Tokyo (JP)

( * ) Notice: Subject to any disclaimer, the term of this patent is extended or adjusted under 35 U.S.C. 154(b) by 312 days.

(21) Appl. No.: 09/740,790

(22) Filed: Dec. 21, 2000

(65) Prior Publication Data

US 2001/0005828 A1 Jun. 28, 2001

(30) Foreign Application Priority Data

Dec. 22, 1999 (JP) ............................................. 11-364145

(51) Int. Cl.$^7$ ............................................. G10L 19/00
(52) U.S. Cl. ..................... 704/501; 704/500; 704/504; 704/201; 380/232; 380/228; 380/279; 369/13; 709/230
(58) Field of Search ................................ 704/201, 270, 704/500, 504, 273, 501, 229; 380/232, 228, 279; 369/13, 30.19; 709/230; 713/176; 370/356; 705/1

(56) References Cited

U.S. PATENT DOCUMENTS

| 5,303,326 | A | * | 4/1994 | Dean et al. .................. 704/201 |
| 5,412,628 | A | * | 5/1995 | Yamazaki et al. ....... 369/30.19 |
| 5,481,645 | A | * | 1/1996 | Bertino et al. .............. 704/270 |

(Continued)

FOREIGN PATENT DOCUMENTS

| JP | 07-129197 | * | 11/1993 | ............. G10L/9/14 |
| JP | 7-231309 | | 8/1995 | |
| JP | 7-325600 | | 12/1995 | |
| JP | 08-063332 | * | 3/1996 | ............. G06F/5/00 |
| JP | 10-135944 | * | 10/1996 | ............. H04L/9/18 |
| JP | 9-73299 | | 3/1997 | |
| JP | 09-265731 | * | 10/1997 | ........... G11B/20/10 |
| JP | 000762417 | A2 | * | 12/1997 | ........... G11B/20/00 |
| JP | 09-319690 | * | 12/1997 | ........... G06F/13/10 |
| JP | 11-202870 | * | 1/1998 | ............ G10H/7/02 |
| JP | 10-136123 | | 5/1998 | |
| JP | 11-328033 | A | * | 5/1998 | ........... G06F/12/14 |
| JP | 11-328033 | * | 5/1998 | ........... G06F/12/14 |
| JP | 10-320000 | | 12/1998 | |
| JP | 11-31130 | | 2/1999 | |
| JP | 11-126099 | * | 5/1999 | ............. G10L/9/18 |
| JP | 11-508709 | | 7/1999 | |
| JP | 11-212461 | * | 8/1999 | ............ G09C/5/00 |
| JP | 2001519099 | * | 10/2001 | .......... H04N/1/387 |
| NL | WO 97/29578 | * | 8/1997 | |

OTHER PUBLICATIONS

Liem et al ("An Embedded System Case Study: The Firm Ware Development Environment For A Multimedia Audio Processor" ACM IEEE Design Automation Conference Proceedings, Mar. 1997).*

(Continued)

Primary Examiner—Vijay B. Chawan
(74) Attorney, Agent, or Firm—Whitham, Curtis & Christofferson, PC (57) ABSTRACT

An audio playback/recording apparatus includes an audio input processing section which receives analog audio data, and converts the analog audio data to digital audio data; a playback/recording processing section which compresses digital audio data output from the audio input processing section and stores the compressed digital audio data into a RAM and which decompresses the compressed digital audio data according to attribution data indicating a type of compression; an audio output processing section which receives the decompressed digital audio data, converts the decompressed digital audio data to analog audio data, and outputs the analog audio data to an output apparatus; and an external recording circuit section which records compressed digital audio data stored in the RAM into an external recording medium, reads out the compressed digital audio data, and stores the data into the RAM.

3 Claims, 8 Drawing Sheets

U.S. PATENT DOCUMENTS

| | | | | |
|---|---|---|---|---|
| 5,511,000 | A | * | 4/1996 | Kaloi et al. .................. 704/201 |
| 5,774,856 | A | * | 6/1998 | Haber et al. ................. 704/201 |
| 5,838,996 | A | | 11/1998 | deCarmo |
| 5,870,710 | A | * | 2/1999 | Ozawa et al. ................ 704/500 |
| 5,987,519 | A | * | 11/1999 | Peifer et al. ................. 709/230 |
| 6,075,784 | A | * | 6/2000 | Frankel et al. .............. 370/356 |
| 6,226,618 | B1 | * | 5/2001 | Downs et al. ............... 380/279 |
| 6,240,185 | B1 | * | 5/2001 | Van Wie et al. ............ 380/232 |
| 6,243,330 | B1 | * | 6/2001 | Oshima ....................... 380/228 |
| 6,253,293 | B1 | * | 6/2001 | Rao et al. .................... 704/500 |
| 6,263,313 | B1 | * | 7/2001 | Milsted et al. .............. 704/500 |
| 6,446,037 | B1 | * | 9/2002 | Fielder et al. ............... 704/229 |
| 6,571,211 | B1 | * | 5/2003 | Dwyer et al. ............... 704/270 |
| 2001/0013097 | A1 | * | 8/2001 | Ito et al. ...................... 713/176 |
| 2001/0032088 | A1 | * | 10/2001 | Utsumi et al. ................. 705/1 |
| 2001/0038578 | A1 | * | 11/2001 | Oshima ........................ 369/13 |

OTHER PUBLICATIONS

Breternitz et al ("Enhanced Compression Techniques to Simplify Program Decompression and Execution", International Conference on Computer Design: VLSI in Computers and Processors, Oct. 1997).*

* cited by examiner

AUDIO PLAYBACK/RECORDING APPARATUS HAVING MULTIPLE DECODERS IN ROM

BACKGROUND OF THE INVENTION

1. Field of the Invention

The present invention relates to an audio playback/recording apparatus, and more particularly to an audio playback/recording apparatus, which performs playback and recording of audio data, and which can record audio data into an external memory or transfer audio data via a general-purpose interface, and which also performs processing related to the protection of digital audio data.

2. Related Art

In an apparatus capable of recording and playback of audio data (including music data), because of the ease of use of compact personal media such as memory cards, widespread growth is being seen in the usage of these media as an external storage medium for a personal computer or portable terminal or the like.

In the field of digital audio as well, these media are gaining attention as the next generation of mechanism-free, vibration-immune recording medium.

In comparison with such recording media as DAT (digital audio tape) and MD (MiniDisc), however, because these media are not superior in terms of cost performance, there is a need for a medium capable of achieving high quality and compressed recording.

In the Japanese Patent Publication (KOKAI) No. 9-73299, there is a disclosure of an MPEG audio playback/recording apparatus capable of playing back easy to hear audio, even with varying playback speed, for audio data subjected to compression and decompression according the MPEG (Moving Picture Expert Group) standard. This apparatus is a dedicated playback apparatus, and requires an external controller such as a microcomputer.

In the Japanese Patent Publication (KOKAI) No. 10-320000, there is a disclosure of a portable audio recording/playback apparatus that performs recording and playback, executing MPEG compression and decompression in real time under microcomputer control.

In the Japanese Patent Publication (KOKAI) No. 7-325600, there is a disclosure of a portable audio recording/playback apparatus having an IC memory card.

The above-noted prior art, however, has the following problems.

The first problem is that it is not possible to accommodate diverse audio data compression systems.

The second problem is that it is not possible to accommodate encryption accompanying the shift to digital audio.

Accordingly, it is an object of the present invention to provide an audio playback/recording apparatus having a means capable of accommodating different types of compression and decompression of audio data, and a means capable of encryption and decryption of digital audio data, and also certification means.

SUMMARY OF THE INVENTION

To achieve the above-noted objects, the present invention adopts the following base technical constitution.

Specifically, a first aspect of the present invention is an audio playback/recording apparatus comprising: an audio input processing section, which receives analog audio data, and converts the analog audio data to digital audio data; a playback/recording processing section having a compression section which compresses the digital audio data output from the audio input processing section and stores the compressed digital audio data and attribution data indicating a type of a compression of the compressed digital audio data into a RAM, and an expansion section which decompresses compressed digital audio data based on attribution data indicating a type of a compression of said compressed digital audio data stored in said RAM; an audio output processing section, which receives decompressed digital audio data output from the playback/recording processing section, converts the decompressed digital audio data to analog audio data, and outputs the analog audio data to an output apparatus; an external recording circuit section, which records compressed digital audio data stored in the RAM into an external recording medium, and reads out compressed digital audio data from the external recording medium, and stores the readout data into the RAM.

In the second aspect of the present invention, a general-purpose interface circuit section, which transfers digital audio data and attribution data indicating a type of a compression of the compressed digital audio data to an external apparatus connected thereto from the external recording medium, and receives digital audio data from the external apparatus and transfers digital audio data and attribution data indicating a type of a compression of the compressed digital audio data to the external recording medium.

In the third aspect of the present invention, a protection processing section for performing protection processing of the digital audio data, is provided.

In the fourth aspect of the present invention, the protection processing section comprising an encryption section which encrypts the digital audio data, a decryption section which decrypts encrypted digital audio data, an authorization data generation section, which generates authorization data sent to the external apparatus connected to the general-purpose interface circuit section, and an authorization data verification section, which verifies authorization data sent from the external apparatus connected to the general-purpose interface circuit section.

In the fifth aspect of the present invention, the protection processing section comprising an encryption section which encrypts digital audio data, a decryption section which decrypts encrypted digital audio data, an authorization data writing section which writes authorization data into digital audio data transferred to the external apparatus connected to the general-purpose interface circuit section, and an authorization data extraction section which extracts authorization data from digital audio data received from the external apparatus connected to the general-purpose interface circuit section.

In the sixth aspect of the present invention, the authorization data writing section writes the authorization data within a header information section of the digital audio data.

DETAILED DESCRIPTION OF THE PREFERRED EMBODIMENTS

Embodiments of the present invention are described in detail below, with references made to relevant accompanying drawings.

(First Embodiment)

Figure 1:
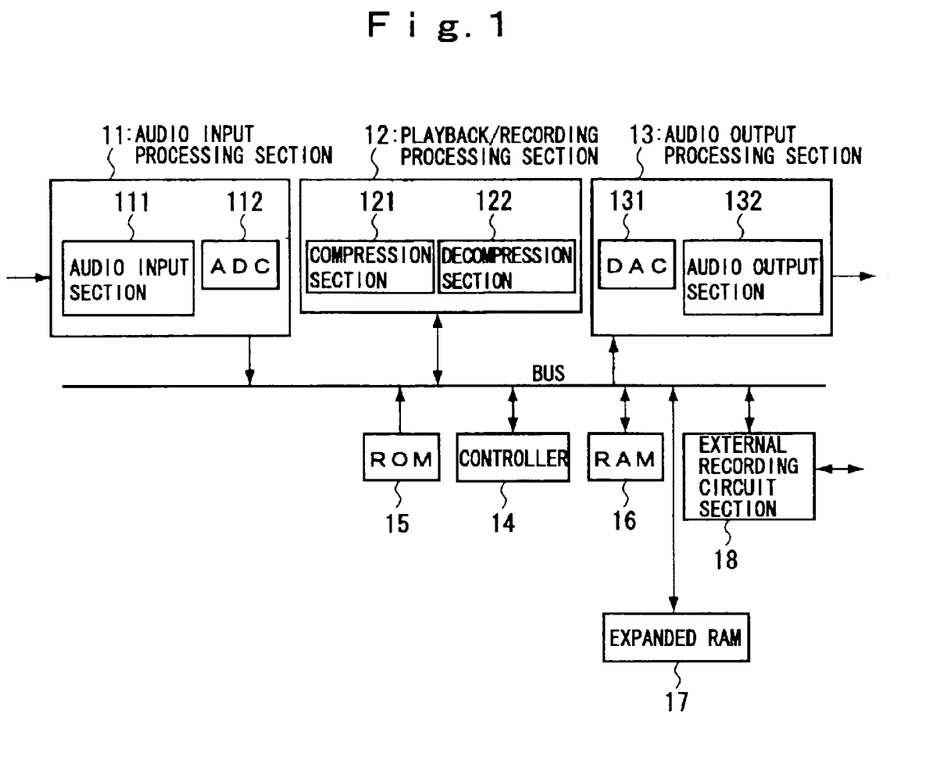
FIG. 1 is a block diagram showing the configuration of a first embodiment of the present invention.

FIG. 1 is a block diagram showing the configuration of a first embodiment of the present invention.

Referring to FIG. 1, the first embodiment of the present invention is formed by an audio input processing section 11, a playback/recording processing section 12, an audio output processing section 13, a controller 14, a ROM 15, a RAM 16, an expanded RAM 17, and an external recording medium 18.

Analog audio data (including a music signal) is input to the audio input processing section 11, and the analog audio data is converted to digital audio data. The audio input processing section 11 includes an audio input section 111 and an analog-to-digital converter (A/DC) 112. It will be understood that the audio data used herein includes sound data and music data.

An analog audio signal from an input apparatus such as a microphone is input to the audio input section 111.

The A/DC 112 is an analog-to-digital converter, which converts the analog audio data from the audio input section 111 to digital audio data, which is also referred to as content.

The playback/recording processing section 12 includes a compression section 121 and a decompression section 122, and performs compression processing and decompression processing of the digital audio data input to the playback/ recording processing section 12.

The compression section 121 compresses the digital audio data. The compression section 121 performs compression processing using compression firmware that has been selected from the processing files in the ROM 15 and loaded on the RAM 16 by the instructions of the controller 14. For example, in the case of MPEG compression, the digital data input to the compression section 121 is subjected to sub-band analysis, scaling, fast Fourier transformation (FFT), masking calculation (auditory response modeling), bit assignment, quantizing, and bit stream generation (formatting), the resulting compressed data being output.

The decompression section 122 decompresses compressed digital audio data, using processing files that have been selected from the processing files in the ROM 15 and loaded on the RAM 16 by the instructions of the controller 14. For example, in the case of MPEG decompression, compressed digital audio data input to the decompression section 122, is subjected to bit stream analysis (format analysis), reverse quantizing, reverse scaling, and sub-band synthesis, the resulting decompressed data being output.

The audio output processing section 13 includes a digital-to-analog converter (D/AC) 131 and an audio output section 132, and outputs analog audio data to an external apparatus.

The D/AC 131 is a digital-to-analog converter, which converts the digital audio data to analog audio data.

The audio output section 132 outputs analog audio data from the D/AC 131 to an externally connected output apparatus such as a speaker or headphones.

The controller 14 is connected to various parts via a bus and, in response to instructions made from function/operating switches (not shown in the drawing) that specify functions and operations for recording, playback, and the like, uses a control program stored in the ROM 15 to perform control of various operations. The controller 14, for example, has a microcomputer and internal control registers and a controller. The controller 14, before processing in various parts, selects a processing file from the ROM 15 and stores firmware used by various parts on the RAM 16. The firmware selected and stored on the RAM 16 by the controller 14 is compression firmware used by the compression section 121 and decompression firmware used by the decompression section 122. The controller 14, in response to instructions from a compression/decompression specifying switch (not shown in the drawing), determines the firmware to be loaded. If there is no specification, default software is loaded.

The ROM 15 is a read-only memory, into which firmware used in processing in various parts is stored as files. The firmware stored in the files is compression firmware and decompression firmware, these firmwares existing for each system type. For example, if there are three types of compression systems, there will exist three types of compression firmwares. The ROM 15 also stores a control program for overall apparatus.

The RAM 16 is a random-access memory, into which firmware read out from a processing file of the ROM 15 by the controller 14 is loaded. A control program to controlling various parts by the controller 14 is also loaded, and this memory is used as a working area for control program execution. Furthermore, the digital audio data output from the compression section 121 and digital audio data read in from the external recording circuit section 18 are loaded on the RAM 16 for the purpose of various processing.

The expanded RAM 17 is a memory or magnetic disk apparatus, which is used as an expanded memory in the case in which it is not possible to store digital audio data in the RAM 16.

The external recording circuit section 18 records digital audio data (content) into an externally connected external recording medium such as an external memory. It is possible to remove the external recording medium recorded by the external recording circuit section 18 and play it back in another apparatus. It is also possible to connect the external recording medium recorded by the external apparatus to the external recording circuit section 18 and play it back by the apparatus shown in FIG. 1.

The operation of the first embodiment of the present invention is described below, with reference made to FIG. 1 to FIG. 3.

Figure 2:
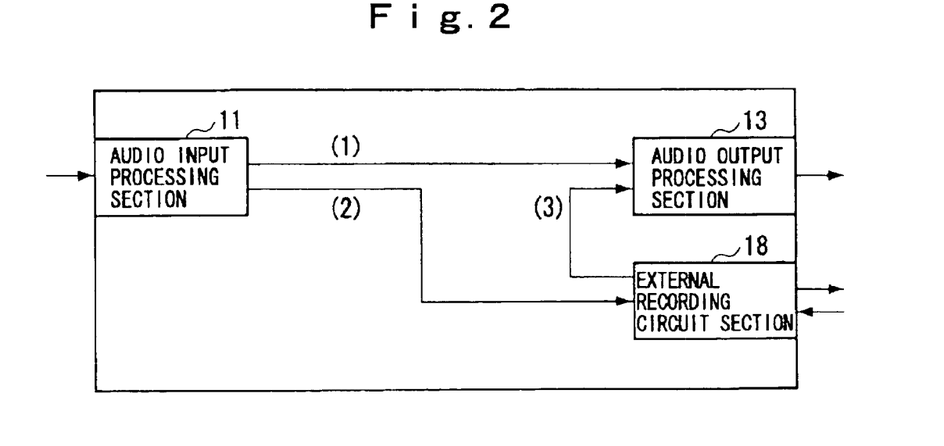
FIG. 2 is a drawing showing the flow of data in the first embodiment of the present invention.

FIG. 2 is a drawing showing the flow of data in the first embodiment of the present invention.

Figure 3A:
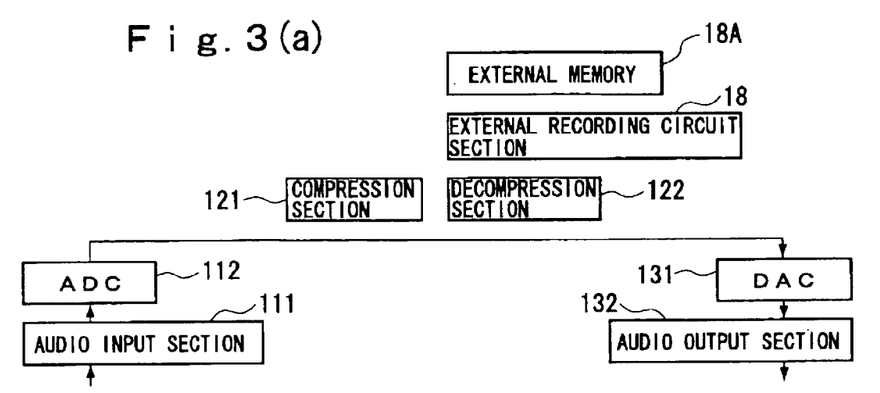
FIGS. 3(a) to 3(c) are drawings showing operations in the first embodiment of the present invention.
Figure 3B:
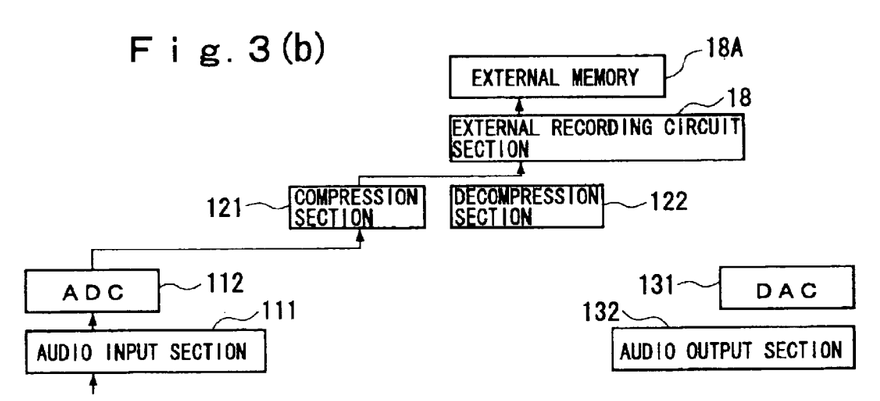
Figure 3C:
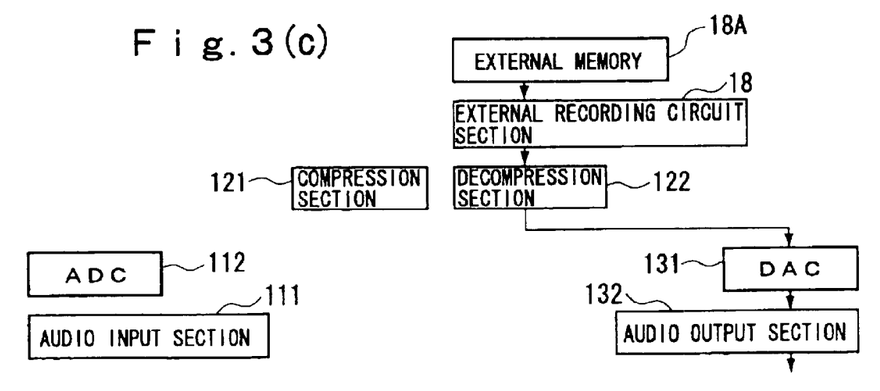

FIGS. 3(a) through (c) are drawings showing the operations in the first embodiment.

The overall data flow will be described below. There are three major types of data flow. The following sections (1) to (3) correspond to (1) to (3) in FIG. 2.

(1) An analog audio signal input to the audio input processing section 11 is output as an analog audio signal from the audio output processing section 13.

(2) An analog audio signal input to the audio input processing section 11 is recorded as digital audio data into an external memory 18A connected to the external recording circuit section 18.

(3) Digital audio data recorded in an external memory 18A connected to the external recording circuit section 18 is output as analog audio data from the audio output processing section 13.

Next, the various types of processing are described below.

First, the operation in which an analog audio signal input to the audio input processing section 11 is output as an analog audio signal from the audio output processing section 13, is described with reference to FIG. 3(*a*).

(a1) An analog audio signal from an input apparatus is input to the audio input section 111.

(a2) The input analog audio data is converted to digital audio data by the A/DC 112 and output to the D/AC 131. In this processing, the compression is performed by the compression section 121, and the compressed audio data is stored in RAM 16.

(a3) The digital audio data is converted to analog audio data by the D/AC 131, thereby converting it to analog audio data.

(a4) The analog audio data is output to an output apparatus as an analog audio signal from the audio output section 132 so as to perform playback thereof.

(a5) Digital audio data compressed and stored in the RAM 16 is recorded in an external memory 18A connected to the external recording circuit section 18. This digital audio data is recorded along with attribution data of the compressed digital audio data that indicates the type of compression of the digital audio data.

The operation in which an analog audio signal input to the audio input processing section 11 is recorded as digital audio data into an external memory 18A connected to the external recording circuit section 18, is described below, with reference made to FIG. 3(*b*).

(b1) An analog audio signal from the input apparatus is input to the audio input section 111.

(b2) The input analog audio data is converted to digital audio data by the A/DC 112, and the digital audio data is compressed by the compression section 121 and stored into the RAM 16, using a specified type of compression.

(b3) Compressed digital audio data stored in the RAM 16 is recorded in the external memory 18A connected to the external recording circuit section 18. In addition to the digital audio data, attribution data of the compressed digital audio data is recorded to indicate the type of compression.

Finally, the operation in which digital audio data recorded in an external memory 18A connected to the external recording circuit section 18 is output as analog audio data from the audio output processing section 13, is described below, with reference to FIG. 3(*c*).

(c1) Compressed digital audio data and attribution data indicating the type of compression are read out from the external memory 18A connected to the external recording circuit section 18, and stored into the RAM 16.

(c2) Compressed digital audio data stored in the RAM 16 is decompressed by the decompression section 122. The decompression is performed using a decompression method corresponding to the compression method indicated by the attribution data.

(c3) The decompressed digital audio data stored in the RAM 16 is converted to analog audio data by the D/AC 131.

(c4) Analog audio data is output from the audio output section 132 to the output apparatus.

(Second Embodiment)

A second embodiment of the present invention is described in detail below, with reference made to relevant accompanying drawings.

The second embodiment differs from the first embodiment in that it has a function enabling reception of digital audio data from an external apparatus.

Figure 4:
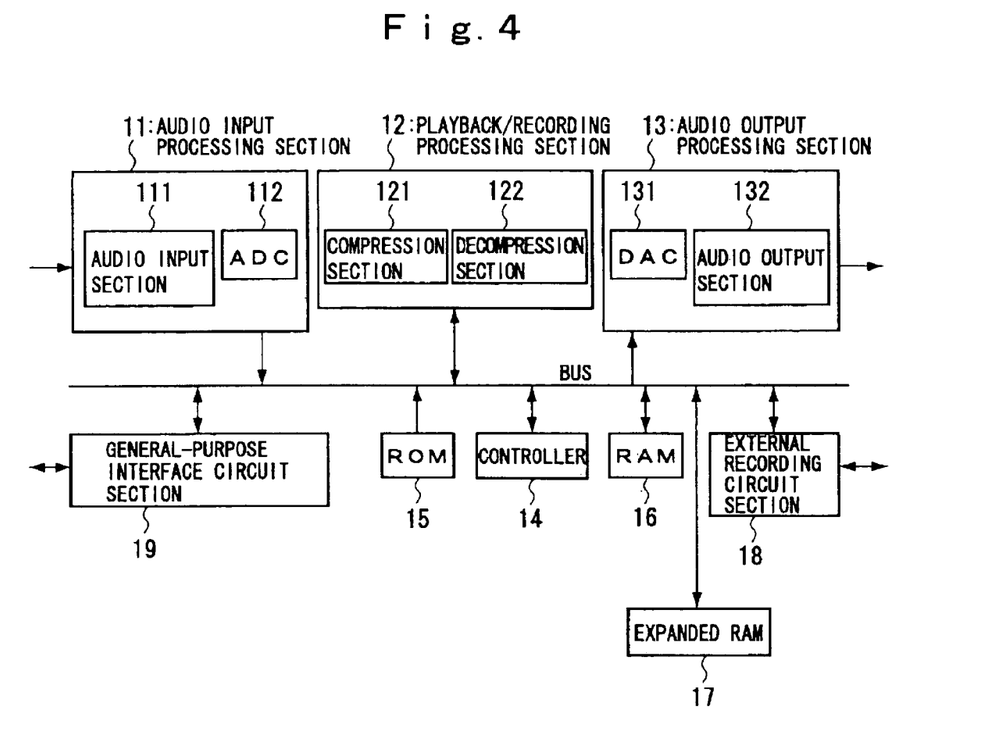
FIG. 4 is a block diagram showing the configuration of a second embodiment of the present invention.

FIG. 4 is a block diagram showing the configuration of the second embodiment of the present invention.

Referring to FIG. 4, the second embodiment is formed by an audio input processing section 11, a playback/recording processing section 12, an audio output processing section 13, a controller 14, a ROM 15, a RAM 16, an expanded RAM 17, an external recording circuit section 18, and a general-purpose interface circuit section 19.

The second embodiment is essentially the first embodiment with the addition of a general-purpose interface circuit section 19.

The type of general-purpose interface includes such interfaces as USB, IEEE 1394, or wireless LAN and Home RF.

The operation of the second embodiment is described in detail below, with reference being made to FIG. 4 to FIG. 6.

Figure 5:
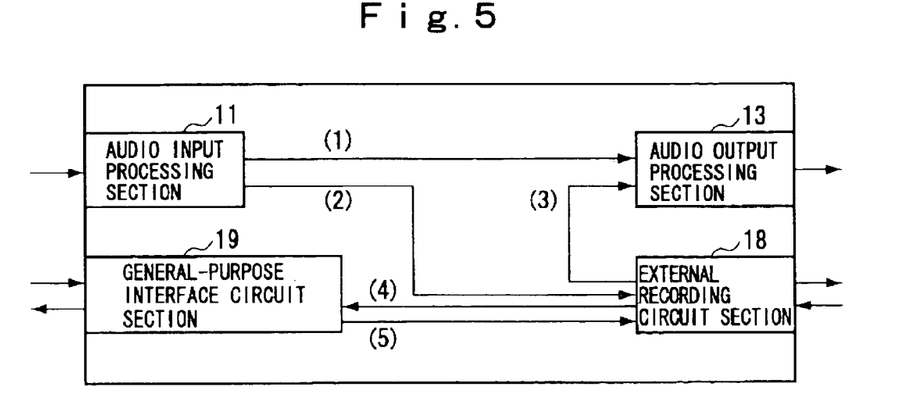
FIG. 5 is a drawing showing the flow of data in the second embodiment of the present invention.

FIG. 5 is a drawing showing the flow of data in the second embodiment.

Figure 6A:
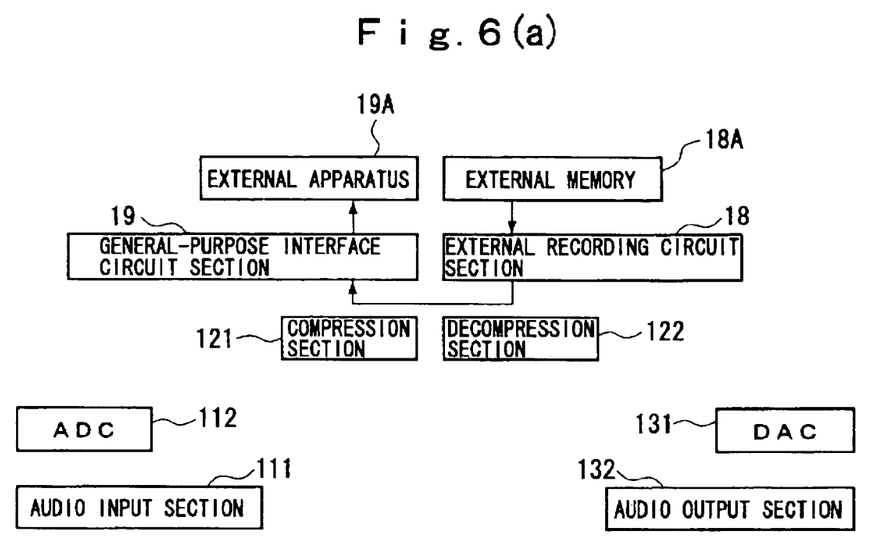
FIGS. 6(a) and 6(b) are drawings showing operations in the second embodiment of the present invention.
Figure 6B:
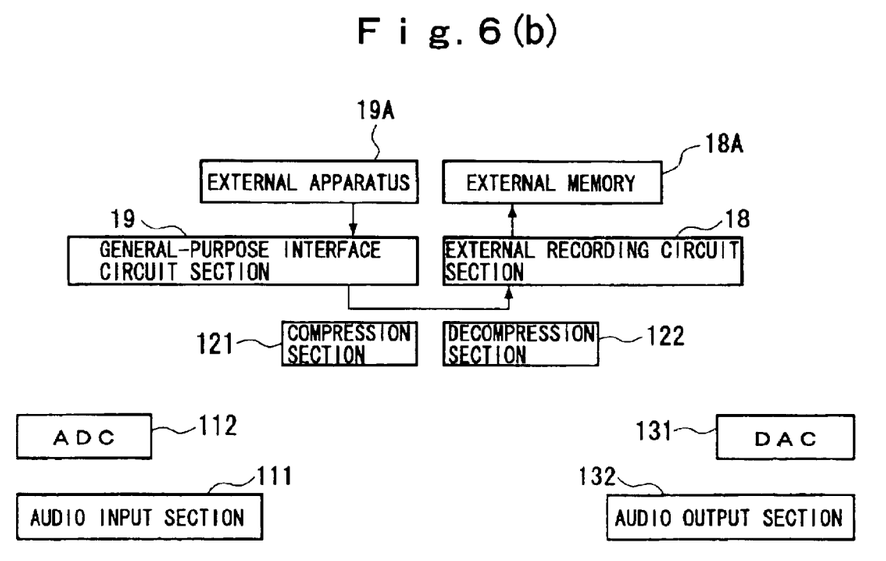

FIG. 6(*a*) and FIG. 6(*b*) are drawings showing the operations in the second embodiment.

The overall data flow will be described first, followed by the operation involved in each type of processing.

In this embodiment, there are five major types of data flow. The following sections (1) to (5) correspond to (1) to (5) in FIG. 5.

(1) An analog audio signal input to the audio input processing section 11 is output as an analog audio signal from the audio output processing section 13.

(2) An analog audio signal input to the audio input processing section 11 is recorded as digital audio data into an external memory 18A connected to the external recording circuit section 18.

(3) Digital audio data recorded in an external memory 18A connected to the external recording circuit section 18 is output as analog audio data from the audio output processing section 13.

(4) Digital audio data recorded in an external memory 18A connected to the external recording circuit section 18 is transferred to an external apparatus 19A connected to the general-purpose interface circuit section 19 as digital audio data.

(5) Digital audio data input from an external apparatus 19A connected to the general-purpose interface circuit section 19 is recorded as digital audio data in an external memory 18A connected to the external recording circuit section 18.

Next, the various types of processing are described below.

Because (1) to (3) described above are the same as in the first embodiment, these will not be explicitly described herein.

The operation of the fourth type (4) in which digital audio data recorded in an external memory 18A connected to the external recording circuit section 18 is transferred to an external apparatus connected to the general-purpose interface circuit section 19, is described below, with reference to FIG. 6(*a*).

(a1) Compressed digital audio data and its attribution data from an external memory 18A connected to the external recording circuit section 18 are read out and stored into the RAM 16.

(a2) The type of compression indicated by the attribution is sent to the external apparatus 19A connected to the general-purpose interface circuit section 19.

(a3) The compressed digital audio data stored in the RAM 16 is transferred to the external apparatus 19A connected to the general-purpose interface circuit section 19.

In the above case, when the digital audio data to be transferred is compressed by a default compression type, the digital audio data being transferred without sending attribution data.

Finally, the operation of the fifth type (5) in which digital audio data input from an external apparatus 19A connected to the general-purpose interface circuit section 19 is recorded as digital audio data in an external memory 18A connected to the external recording circuit section 18, is described below, with reference to FIG. 6(b).

(b1) The type of compression of the digital audio data to be captured from the external apparatus 19A connected to the general-purpose interface circuit section 19 is received.

(b2) Digital audio data is captured from the external apparatus 19A connected to the general-purpose interface circuit section 19 and stored in the RAM 16.

(b3) Compressed digital audio data stored in the RAM 16 is recorded in an external memory 18A connected to the external recording circuit section 18.

(b4) The attribution data of the received compression type is recorded into the external memory connected to the external recording circuit section 18.

In the above case, when the digital audio data captured is compressed by a default compression type, it is possible to record the compressed digital audio data into the external memory without receiving the compression type.

(Third Embodiment)

A third embodiment of the present invention is described in detail below, with reference made to relevant accompanying drawings.

The third embodiment differs from the second embodiment in that it has a function of receiving digital audio data accompanying authorization data from an external apparatus and sending digital audio data accompanying authorization data to the external apparatus.

Figure 7:
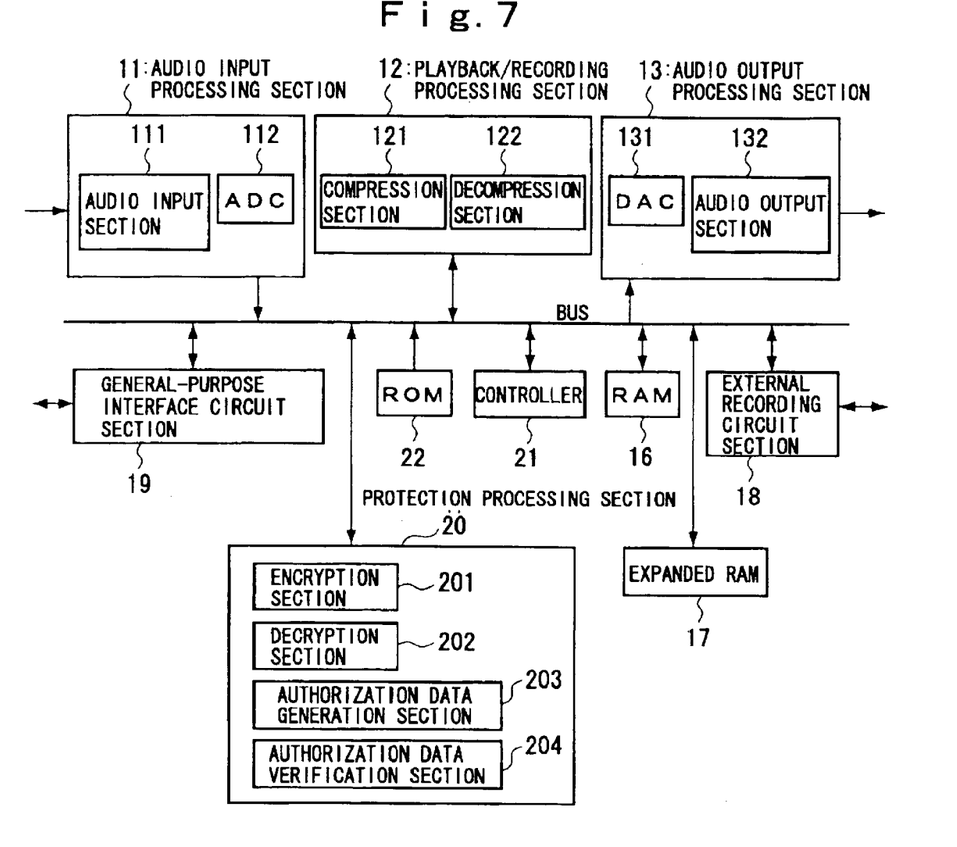
FIG. 7 is a block diagram showing the configuration of a third embodiment of the present invention.

FIG. 7 is a block diagram showing the configuration of the third embodiment of the present invention.

Referring to FIG. 7, the third embodiment of the present invention is formed by an audio input processing section 11, a playback/recording processing section 12, an audio output processing section 13, a controller 21, a ROM 22, a RAM 16, an expanded RAM 17, an external recording circuit section 18, a general-purpose interface circuit section 19, and a protection processing section 20.

The third embodiment is essentially the second embodiment shown in FIG. 4, with the addition of the protection processing section 20, the controller 14 replaced by the controller 21, and the ROM 15 replaced by the ROM 22.

The protection processing section 20 added to the second embodiment to form the third embodiment and the ROMs 21 and 22 are described below.

The protection processing section 20 performs processing related to the protection of digital audio data. The protection processing section 20 includes a encrypting section 201, a decryption section 202, an authorization data generation section 203, and an authorization data verification section 204.

The encryption section 201 performs encryption of digital audio data. The encryption section 201 performs encryption by using encryption firmware selected by the controller 21 from processing files in the ROM 2 and stored in the RAM 16.

The decryption section 202 performs decryption of encrypted digital audio data. The decryption section 202 performs decryption by using decryption firmware selected by the controller 21 from processing files in the ROM 2 and stored in the RAM 16.

The authorization data generation section 203 generates authorization data that is sent to the external apparatus connected to the general-purpose interface circuit section 19. The authorization data serves as clearly identifying person who transfer data, and is formed by an individual ID (identifier) and a decryption key. The individual ID (identifier) and the decryption key are registered beforehand in the ROM 22. The authorization data is sent prior to transfer of digital audio data to the external apparatus.

The authorization data verification section 204 performs verification of authorization data sent from the external apparatus connected to the general-purpose interface circuit section 19. It performs a comparison of the individual ID (identifier) included in the received authorization data with an individual ID (identifier) list stored in the ROM 22 to check the properness of the transmitting party. The decryption key is stored in the RAM 16 for the purpose of processing by the decryption section 202. The authorization data is received before receiving digital audio data from the external apparatus.

The controller 21 is connected to various parts, and performs control of the operation of various parts by using a control program stored in the ROM 22. The controller 21 is, for example, a microcomputer and internal control registers and a controller. The controller 21, before processing in various parts, selects a processing file from the ROM 22 and stores firmware used by various parts into the RAM 16. The firmware selected and stored into the RAM 16 by the controller 21 is compression firmware used by the compression section 121, decompression firmware used by the decompression section 122, encryption firmware used by the encryption section 201, and decryption firmware used by the decryption section 202. The controller 21, in response to instructions from encryption/decryption specifying switches (not shown in the drawing) commands the firmware to be expanded. If there are no instructions, default software is used.

The ROM 22 is a read-only memory, into which firmware used in processing in various parts is stored as files. The firmware stored in the RAM 16 is compression firmware, decompression firmware, encryption firmware and decryption firmware. The firmwares are specific for each system type. For example, if there are three types of compression systems, there will exist three types of compression firmwares. The ROM 22 also stores a control program for the apparatus overall. In addition, the ROM 22 also stores the individual ID (identifier) used in authorization data processing in the protection processing section 20, a decryption key, and an individual ID (identifier) list.

The operation of the third embodiment is described in detail below, with reference made to FIG. 7 to FIG. 9.

Figure 8:
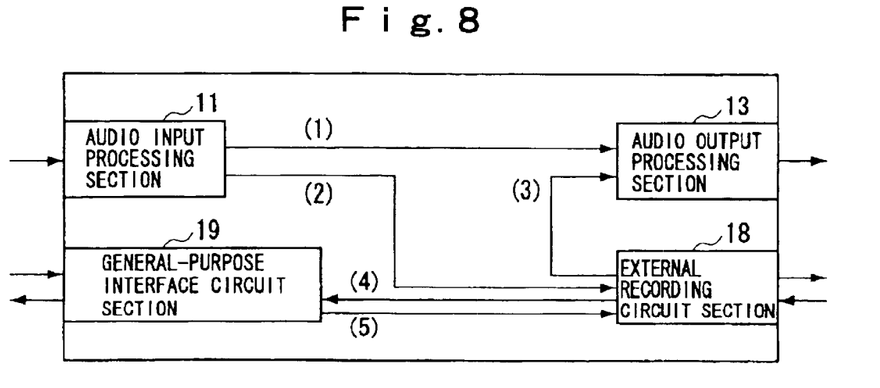
FIG. 8 is a drawing showing the flow of data in the third embodiment of the present invention.

FIG. 8 is a drawing showing the flow of data in the third embodiment.

Figure 9A:
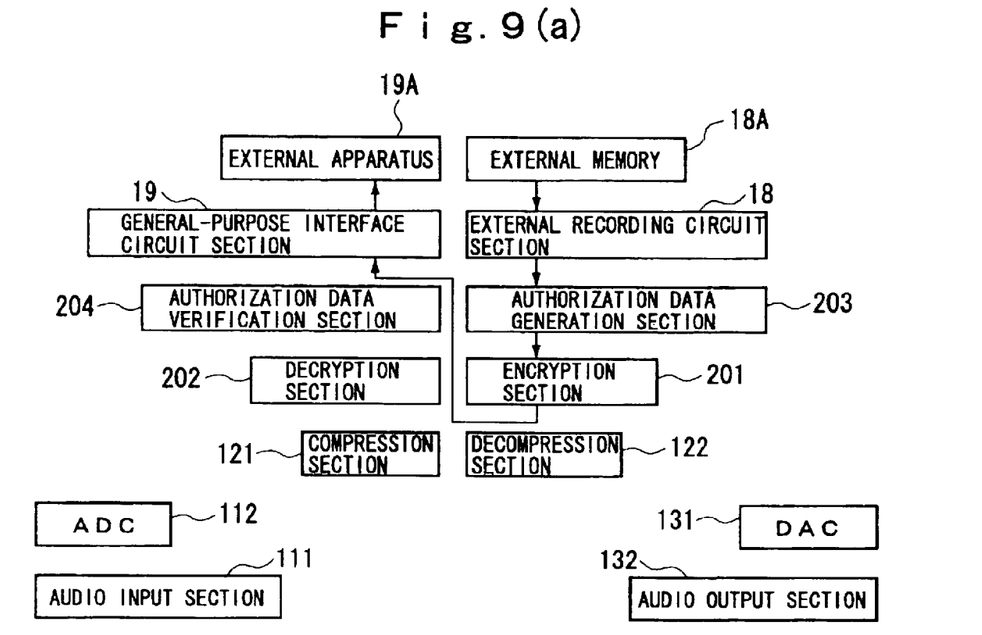
FIGS. 9(a) and 9(b) are drawings showing operations in the third embodiment of the present invention.
Figure 9B:
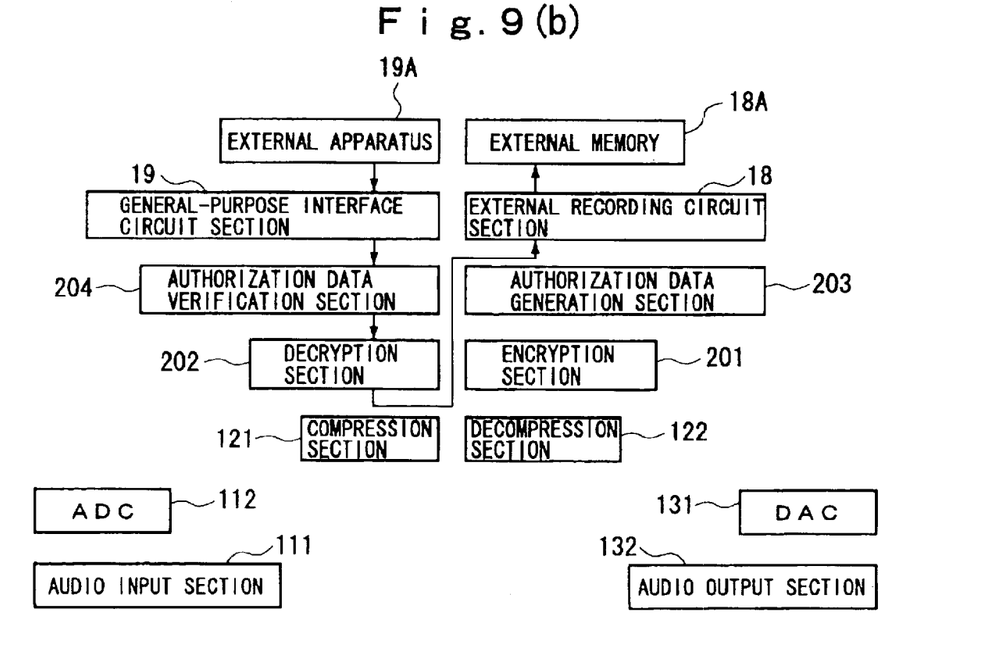

FIG. 9(a) and FIG. 9(b) are drawings showing the operations in the third embodiment.

The overall data flow will be described first, followed by the operation involved in each type of processing.

In the third embodiment, there are five major types of data flow, these corresponding to the numbers (1) to (5) in FIG. 8. Although the data flows indicated by (1) to (5) are similar to the case of the second embodiment, (4) and (5) differ in that the digital audio data accompanies the authorization data. For this reason, the description below will cover the data flows of (4) and (5) shown in FIG. 8.

(4) Digital audio data recorded in an external memory 18A connected to the playback/recording processing section 18 is transferred as digital audio data with authorization data to the external apparatus 19A connected to the general-purpose interface circuit section 19.

(5) The input digital audio data and accompanying authorization data from the external apparatus 19A connected to the general-purpose interface circuit section 19 is recorded as digital audio data into an external memory 18A connected to the playback/recording processing section 18.

Next, the operation for each type of processing is described below.

Because (1) to (3) described above are the same as in the first and second embodiments, these will not be explicitly described herein.

The operation of the fourth type (4) in which digital audio data recorded in an external memory 18A connected to the playback/recording processing section 18 is transferred as digital audio data with authorization data to the external apparatus 19A connected to the general-purpose interface circuit section 19, is described below with reference to FIG. 9(a).

(a1) Compressed digital audio data and its attribution data from an external memory 18A connected to the external recording circuit section 18 are read out and stored into the RAM 16.

(a2) The authorization data generation section 203 generates authorization data comprising a decrypting key corresponding to the encryption method of the compressed digital audio data to be decrypted and an individual ID (identifier).

(a3) Compressed digital audio data stored in the RAM 16 is encrypted by the encryption section 201, using a specified encryption method.

(a4) Authorization data is sent to the external apparatus 19A connected to the general-purpose interface circuit section 19. When this is done, attribution data indicating the type of compression is also sent to the external apparatus 19A.

(a5) Next, the compressed encrypted digital audio data stored in the RAM 16 is transferred to the external apparatus 19A connected to the general-purpose interface circuit section 19.

Finally, the operation of the fifth type (5) in which the input digital audio data and accompanying authorization data from the external apparatus 19A connected to the general-purpose interface circuit section 19 is recorded as digital audio data into an external memory 18A connected to the playback/recording processing section 18, is described below with reference to FIG. 9(b).

(b1) The authorization data of the digital audio data to be captured is received from the external apparatus 19A connected to the general-purpose interface circuit section 19 and stored into the RAM 16. When this is done, the attribution data indicating the type of compression of the digital audio data is also received.

(b2) The authorization data verification section 204 verifies the individual ID (identifier) included in the authorization data, and stores the decryption key included in the authorization data into the RAM 16.

(b3) Compressed encrypted digital audio data is captured from the external apparatus 19A connected to the general-purpose interface circuit section 19, and stored the captured data into the RAM 16.

(b4) The compressed encrypted digital audio data stored in the RAM 16 is decrypted by the decryption section 202, using the decryption key stored in the RAM 16.

(b5) Compressed digital audio data stored in the RAM 16 is recorded in the external memory 18A connected to the external recording circuit section 18. When this is done, the attribution data indicating compression type of the received audio data is also recorded.

(Fourth Embodiment)

A fourth embodiment of the present invention is described in detail below, with references made to relevant accompanying drawings.

The fourth embodiment differs from the second embodiment in that it has a function of receiving digital audio data accompanying authorization data from an external apparatus and sending digital audio data accompanying authorization data to the external apparatus.

Figure 10:
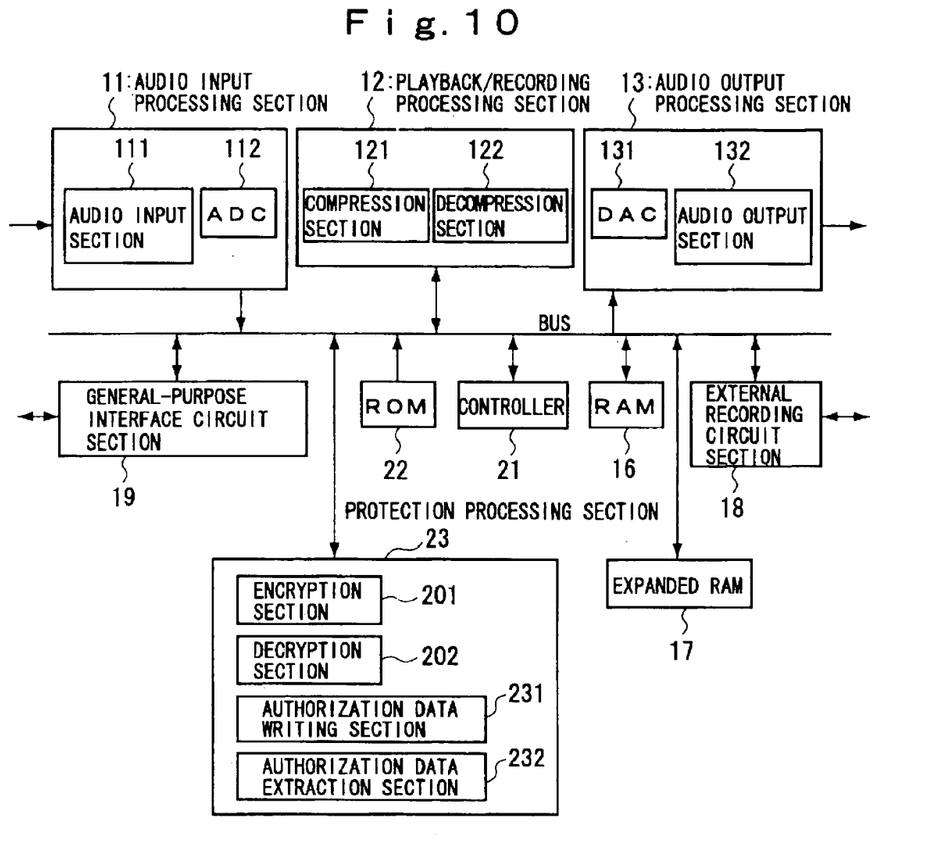
FIG. 10 is a block diagram showing the configuration of a fourth embodiment of the present invention.

FIG. 10 is a block diagram showing the configuration of the fourth embodiment.

Referring to FIG. 10, the fourth embodiment is formed by an audio input processing section 11, a playback/recording processing section 12, an audio output processing section 13, a controller 21, a ROM 22, a RAM 16, an expanded RAM 17, an external recording circuit section 18, a general-purpose interface circuit section 19, and a protection processing section 23.

The fourth embodiment is essentially the third embodiment with the protection processing section 20 replaced by the protection processing section 23.

The protection processing section 23 of the fourth embodiment is described below.

The protection processing section 23 performs processing related to the protection of digital audio data. The protection processing section 23 includes an encryption section 201, a decryption section 202, an authorization data writing section 231, and an authorization data extraction section 232.

Because the encryption section 201 and the decryption section 201 are the same as in the third embodiment, they are not explicitly described herein.

The authorization data writing section 231 writes authorization data as header information into the digital audio data.

The authorization data extraction section 232 extracts header information from the digital audio data, and performs a check of the properness of a sending party by performing a comparison between the individual ID (identifier) extracted from the header information and an individual ID (identifier) list stored in the ROM 22. Additionally, it stores the decryption key extracted from the header information into the RAM 16 for the purpose of decryption processing in the decryption section 202.

The operation of the fourth embodiment is described below in detail, with references being made to FIG. 10 to FIG. 12.

Figure 11:
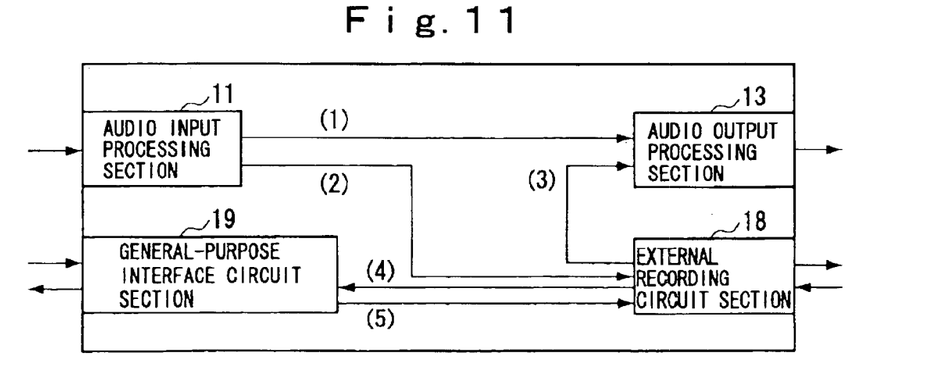
FIG. 11 is a drawing showing the flow of data in the fourth embodiment of the present invention.

FIG. 11 is a drawing showing the flow of data in the fourth embodiment.

Figure 12A:
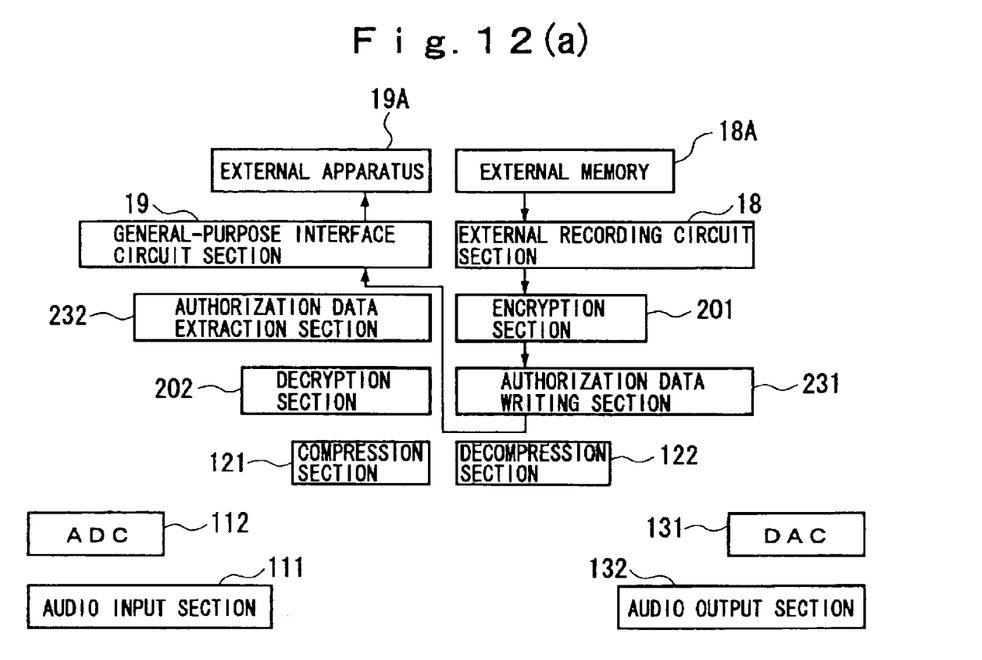
FIGS. 12(a) and 12(b) are drawings showing operations in the fourth embodiment of the present invention.
Figure 12B:
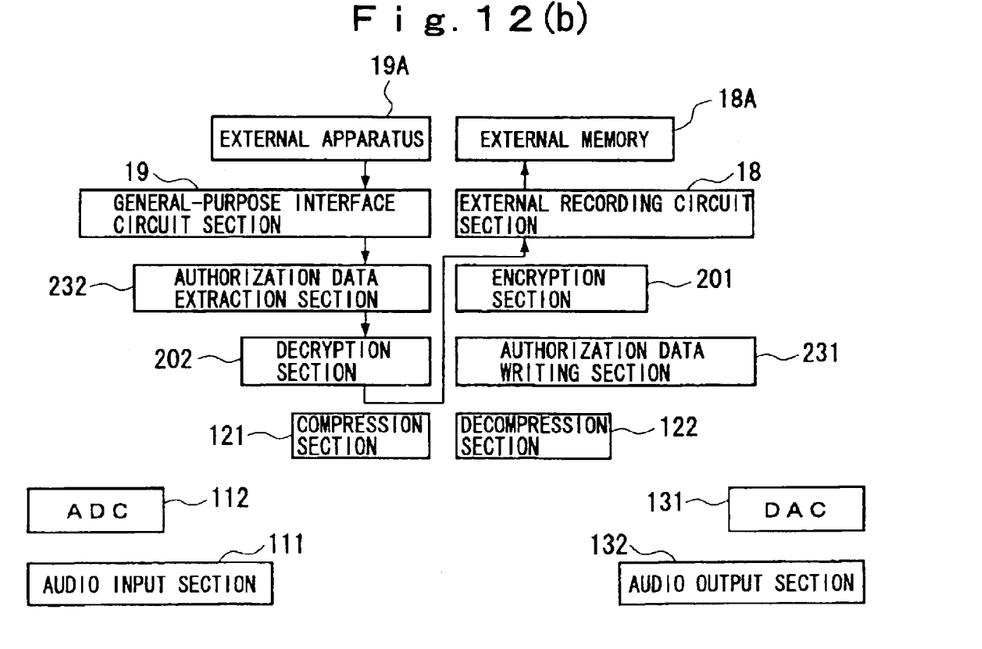

FIG. 12(a) and FIG. 12(b) are drawings showing the operations in the fourth embodiment.

The overall data flow will be described first, followed by the operation involved in each type of processing.

In this embodiment, there are five major types of data flow, these corresponding to the numbers (1) to (5) in FIG. 11. Although the data flows indicated by (1) to (3) are similar to the case of the second embodiment, (4) and (5) differ in that digital audio data with authorization data is handled. For this reason, the description below will cover the data flows (4) and (5).

(4) Digital audio data recorded in an external memory 18A connected to the playback/recording processing section 18 is transferred as digital audio data with authorization data to the external apparatus 19A connected to the general-purpose interface circuit section 19.

(5) The digital audio data and accompanying authorization data from the external apparatus 19A connected to the general-purpose interface circuit section 19 is recorded as digital audio data into an external memory 18A connected to the playback/recording processing section 18.

Next, the operation for each type of processing is described below.

The operation of the fourth type (4) in which digital audio data recorded in an external memory 18A connected to the playback/recording processing section 18 is transferred as digital audio data with authorization data to the external apparatus 19A connected to the general-purpose interface circuit section 19 is described below with reference to FIG. 12(a).

(a1) Compressed digital audio data and attribution data indicating the type of compression is read out from the external memory 18A connected to the external recording circuit section 18 and stored into the RAM 16.

(a2) The compressed digital audio data stored in the RAM 16 is encrypted by the encryption section 201, using a specified type of encryption (a3) The authorization data writing section 231 generates authorization data having a decryption key for the purpose of decrypting the compressed encrypted digital audio data and the individual ID (identifier), and stores these data in the RAM 16 as header information of the encrypted digital audio data. When this is done, the attribution data indicating compression type is also stored as header information.

(a4) Compressed digital audio data accompanying authorization data within header information stored in the RAM 16 is transferred to an external apparatus 19A connected to the general-purpose interface circuit section 19.

Finally, the operation of the fifth type (5) in which the digital audio data and accompanying authorization data from the external apparatus 19A connected to the general-purpose interface circuit section 19 is recorded as digital audio data into an external memory 18A connected to the playback/recording processing section 18, is described below with reference made to FIG. 12(b).

(b1) Compressed encrypted data accompanying authorization data within header information is received from the external apparatus 19A connected to the general-purpose interface circuit section 19, and stored received data into the RAM 16.

(b2) The authorization data extraction section 232 extracts header information from encrypted compressed digital audio data stored in the RAM 16, and verifies the individual ID (identifier) included in the header information. The decrypted key extracted from the authorization data extraction section 232 is stored into the RAM 16.

(b3) Compressed encrypted digital audio data stored in the RAM 16 is decrypted by the decryption section 202, using the decryption key stored in the RAM 16.

(b4) Compressed digital audio data stored in the RAM 16 is recorded into the external memory 18A connected to the external recording circuit section 18. When this is done, the attribution data indicating compression type is also recorded as header information.

Although the foregoing first to fourth embodiments of the present invention are described for the case in which digital audio data is recorded in compressed form into an external memory connected to the external recording circuit section 18, along with the attribution data indicating the type of compression, it will be understood that it is alternately possible to record digital data in uncompressed form.

Additionally, when using a default method of compression, it is possible to omit the recording of the attribution data indicating the type of compression. In this case, when digital audio data is decompressed, a default decompression method is used.

Additionally, although the second to fourth embodiments are described for the case in which the digital audio data exchanged with the external apparatus connected to the general-purpose interface circuit section 19 is compressed data, it is similarly possible to handle digital audio data that is not compressed.

In the above-described first to fourth embodiments, the descriptions were for the case in which specifications of functions, compression/decompression methods, and encryption/decryption were made using switches, it will be understood that it is alternately possible to provide a selection controller, an LCD display controller and LCD display, in which case the selection controller displays information on the LCD display for the purpose of making specifications of function, operations, compression/decompression type, and encryption/decryption and the like, notification of selected information being made to the controller 14.

Additionally, although in the above-noted third and fourth embodiments, the descriptions were for the case in which digital audio data recorded into an external memory connected to the external recording circuit section 18 is compressed data, it can also be encrypted.

The audio data/signal used in the specification includes sound data/signal, audio data/signal and music data/signal.

The present invention in its various embodiments achieves a number of effects.

One effect is that digital audio data (content) is protected, thereby enabling protection against unauthorized transfer or copying of data. This effect is achieved by providing a protection processing section that performs encryption and decryption processing.

Another effect of the present invention is that it is possible to perform compression and decompression of digital audio data in real time. This effect is achieved by providing a playback/recording processing section that performs compression and decompression, thereby enabling real-time compression and real-time decompression while receiving audio data.

Yet another effect of the present invention is that it simplifies the exchange of high-quality digital audio data both over the Internet and the like and using a recording medium. It achieves this effect by providing a general-purpose interface circuit section for performing transfer with other apparatuses and an external recording circuit section for recording into an external recording medium.

What is claimed is:

1. A playback/recording method of digital audio data using an audio playback/recording apparatus having a playback/recording processing section, an audio output processing section, an external recording circuit section, a general-purpose interface circuit section, a protection processing section, a ROM, a RAM, and an expanded RAM, said method comprising:

A) in a case in which input data input to the audio playback/recording apparatus are played back and recorded on an external recording medium, said audio input processing section receives analog audio data from an input apparatus connected thereto and converts said analog audio data to digital audio data and outputs said digital audio data to the audio output processing section and playback/recording processing section, said audio output processing section converts said received digital audio data to analog audio data and plays back said converted analog audio data, said playback/recording processing section compresses said digital audio data and stores said compressed digital audio data in said RAM, and after said audio output processing section plays back said digital audio data, said external recording circuit section records compressed digital audio data stored in said RAM into an external recording medium;

B) in a case in which input data input to the audio playback/recording apparatus are recorded on an external recording medium, said audio input processing section receives analog audio data from an input apparatus connected thereto and converts said analog data audio data to digital audio data and outputs said digital audio data to the playback/recording processing section, said play back/recording processing section compresses said digital audio data and stores said compressed digital audio data in said RAM, and said external recording circuit section records compressed digital audio data stored in said RAM on the external recording medium;

C) in a case in which recorded data on an external recording medium are played back, said external recording circuit section reads out compressed digital audio data from the external recording medium and stores said readout data into said RAM, said playback/recording processing section decompresses said compressed digital audio data stored in said RAM, and said audio output processing section converts said decompressed digital audio data to analog audio data and outputs said converted analog data to an output apparatus and plays back said analog audio data;

D) in a case in which recorded data on an external recording medium are transferred to an external apparatus, said external recording circuit section reads out compressed digital audio data from the external recording medium and stores said readout data into said RAM, said protection processing section generates authorization data including an individual identifier and an encryption key so as to encrypt data and encrypts said compressed digital audio data stored in said RAM, said general-purpose interface circuit section outputs said authorization data to said external apparatus, after that, outputs encrypted compressed digital audio data to said external apparatus; and E) in a case in which input data received from an external apparatus are recorded on an external recording medium, said general-purpose interface circuit section receives authorization data including a decryption key from the external apparatus, said protection processing section compares said individual identifier included in said authorization data from the external apparatus with an individual identifier list stored in the ROM and checks a properness of a transmitting party, said general-purpose interface circuit section receives encrypted compressed digital audio data from the external apparatus and stores them in the RAM, said protection processing section decrypts encrypted compressed digital audio data stored in the RAM by using the decryption key included in the authorization data, and said external recording circuit section records the compressed digital audio data stored in the RAM into the external recording medium.

2. An audio playback/recording apparatus according to claim 1, further comprising an authorization data writing section which writes said authorization data within a header information section of said digital audio data.

3. An audio playback/recording apparatus according to claim 1 wherein said interfaces of said general-purpose interface circuit section arc selected from the group consisting of USB, IEEE1394, wireless LAN, and home RF.

* * * * *